United States Patent [19]

Voorman

[11] Patent Number: 4,780,690
[45] Date of Patent: Oct. 25, 1988

[54] FILTER ARRANGEMENT HAVING A TRANSCONDUCTANCE CIRCUIT

[75] Inventor: Johannes O. Voorman, Eindhoven, Netherlands

[73] Assignee: U.S. Philips Corporation, New York, N.Y.

[21] Appl. No.: 33,139

[22] Filed: Mar. 31, 1987

[30] Foreign Application Priority Data

Nov. 14, 1986 [NL] Netherlands ............... 8602894

[51] Int. Cl.$^4$ ............................................. H03F 1/38
[52] U.S. Cl. ..................................... 330/294; 330/303
[58] Field of Search ............... 330/252, 261, 294, 107, 330/109, 303

[56] References Cited

U.S. PATENT DOCUMENTS 4,509,019 4/1985 Banu et al. ................... 330/107

Primary Examiner—Gene Wan
Attorney, Agent, or Firm—Steven R. Biren

[57] ABSTRACT

In a filter arrangement having a transconductance circuit, a first capacitor is arranged between the inverting output and the non-inverting input of a balanced amplifier and a second capacitor is arranged between the non-inverting output and the inverting input. The outputs of a transconductance circuit (transconductor) are connected to the non-inverting input and the inverting input, which transconductor converts a balanced input voltage applied to the inputs into a balanced output current, its transconductance being variable by means of a variable current source. Further, the transconductor is loaded by a load circuit comprising a first current-source transistor and a second current-source transistor whose common base is connected, via a diode, to the junction point between two resistors arranged between the outputs of the transconductor.

8 Claims, 3 Drawing Sheets

FILTER ARRANGEMENT HAVING A TRANSCONDUCTANCE CIRCUIT

BACKGROUND OF THE INVENTION

The invention relates to a filter arrangement comprising a balanced amplifier having an inverting input, a non-inverting input, an inverting output, a non-inverting output, a first input terminal and a second input terminal, a first feedback circuit comprising a first capacitor and arranged between the non-inverting output and the inverting input, and a second feedback circuit comprising a second capacitor substantially identical to the first capacitor and arranged between the inverting output and the non-inverting input.

Such a filter arrangement is known from U.S. Pat. No. 4,509,019. Said filter arrangement constitutes an integrator. Between the two input terminals and the two inputs of its amplifier two MOS resistors are arranged. The resistance values of these resistors can be adjusted by means of a control voltage applied to the gate electrode. This control voltage enables the RC-time constant of the resistor and the capacitor to be adjusted to the desired value.

A balanced input voltage is applied to the first input terminal and the second input terminal of the filter arrangement and a balanced output voltage is available on the inverting output and the non-inverting output of the amplifier. This output voltage is substantially exempt of even-order harmonic distortion, which is caused inter alia by non-linearities of the MOS resistors. This is because such distortions are cancelled as a result of the balanced drive and the symmetrical construction of the arrangement.

A drawback of this known arrangement is that the time constant of the arrangement is only adjustable over a comparatively small range, because the resistance values of the MOS transistors can be varied only over a comparatively small range.

SUMMARY OF THE INVENTION

Therefore, it is the object of the invention to provide a filter arrangement whose time constant can be adjusted over a comparatively wide range. In accordance with the invention a filter arrangement of the type defined above is characterized in that the filter arrangement further comprises a transconductance circuit with variable transconductance, which circuit comprises two inputs connected to the input terminals of the filter arrangement and two outputs coupled to the inverting and non-inverting inputs of the amplifier. A transconductance circuit is a voltage-controlled current source by means of which a balanced input voltage is converted into a balanced output current. The proportionality factor between the output current and the input voltage is given by the transconductance (1/R). Generally, this transconductance can be varied over a comparatively wide range, thus also enabling the time constant of the filter arrangement to be varied over a comparatively wide range.

A first embodiment of a filter arrangement in accordance with the invention is characterized in that a load circuit is arranged between the outputs of the transconductance circuit which load circuit comprises two currentsource transistors whose collectors are connected to the outputs of the transconductance circuit and whose bases are connected to a common control input which is coupled to the junction point of two resistors arranged between the outputs of the transconductance circuit. The output currents of the transconductance circuits are fed directly to the inputs of the amplifier. The load circuit accurately defines the direct voltages on the outputs and ensures that only the signal currents are transferred to the outputs.

A second embodiment of the filter arrangement in accordance with the invention may be characterized in that the transconductance circuit comprises a differential amplifier with two transistors whose bases are connected to the input terminals, whose collectors are connected to the outputs of the transconductance circuit, and whose emitters are connected to a common current source whose current is variable. A differential amplifier is the simplest form of a transconductance circuit. The transconductance of such a circuit can be varied by varying the current supplied by the common emitter-current source. In such a transconductance circuit the signal currents increase as a linear function of the input voltage over a comparatively small range only, so that the transconductance is constant only over a comparatively small range of input voltages. A larger linear input voltage range of the transconductance circuit can be obtained in a third embodiment of a filter arrangement in accordance with the invention, characterized in that the transconductance circuit comprises two differential amplifiers each comprising two transistors which have unequal emitter areas and whose emitters are connected to a common current source whose current is variable, of which two differential amplifiers the bases are interconnected and the collectors of two transistors with different emitter areas are connected to each other to an output of the transconductance circuit. In the case of a suitable choice of the ratio between the emitter areas the linear range of this transconductor is substantially five times as large as that of a single differential amplifier.

An even larger linear range of the transconductance circuit can be obtained, if the filter arrangement in accordance with a fourth embodiment is characterized in that the transconductance circuit comprises a differential amplifier with two transistors, whose bases are connected to the input terminals, whose collectors are connected to the outputs of the transconductance circuit, and whose emitters are connected to a common current source whose current is variable, and in that a voltage divider is arranged between the bases of the two transistors and has its junction point connected to the bases of two transistors whose emitters are connected to the common current source and whose collectors are connected to the outputs of the transconductance circuit.

Instead of bipolar transistors the transconductance circuit may comprise field-effect transistors. In accordance with a fifth embodiment the transconductance circuit may then be characterized in that it comprises a first differential amplifier with two field-effect transistors whose source electrodes are connected to a first common current source and whose drain electrodes are connected to the outputs of the transconductance circuit, and a second differential amplifier arranged in parallel with said first differential amplifier and comprising two field-effect transistors whose source electrodes are connected to a second common current source and whose drain electrodes are cross-coupled to the drain electrodes of the field-effect transistors of the first differential amplifier.

A sixth embodiment of a filter arrangement in accordance with the invention is characterized in that the balanced amplifier comprises two transistors arranged as a differential pair, whose bases are coupled to the non-inverting input and the inverting input and whose collectors are connected to the inverting output and the noninverting output of the amplifier, between which two outputs a load circuit is arranged comprising two current-source transistors whose collectors are connected to the inverting output and the non-inverting output of the amplifier and whose bases are connected to a common control input which is coupled to the junction point between two load resistors arranged between the outputs of the amplifier.

Generally, such a filter arrangement in accordance with the invention is utilized in circuits in which it is coupled to a second filter arrangement. In accordance with a further embodiment the input terminals of the second filter arrangement are connected to the tappings provided on the load resistors of the load circuit of the amplifier of the first filter arrangement.

BRIEF DESCRIPTION OF THE DRAWING

Embodiments of the invention will now be described in more detail, by way of example, with reference to the accompanying drawings, in which.

DESCRIPTION OF THE PREFERRED EMBODIMENTS

Figure 1:
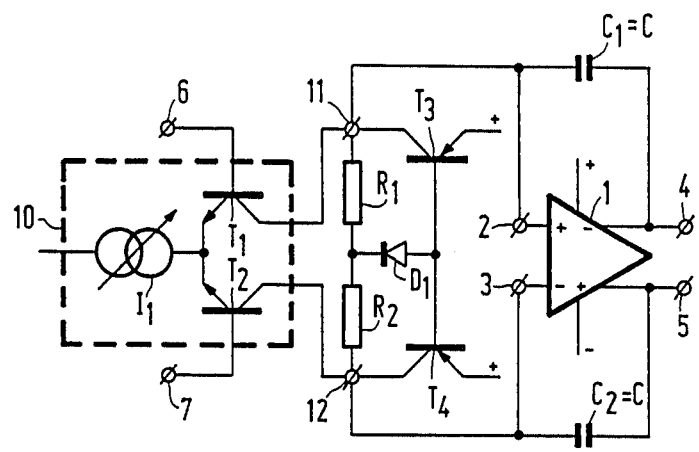
FIG. 1 is a basic diagram of a filter arrangement in accordance with the invention.

FIG. 1 shows the basic diagram of a filter arrangement in accordance with the invention. The filter arrangement comprises an amplifier 1 having a non-inverting input 2, an inverting input 3, an inverting output 4 and a noninverting output 5. Further, the filter arrangement comprises a transconductance circuit 10, briefly referred to as transconductor. The simplest form of such a transconductor 10 is a differential amplifier comprising two transistors $T_1$ and $T_2$ whose bases are connected to the input terminals 6 and 7 of the filter arrangement and whose emitters are connected to an adjustable common current source $I_1$. The collectors of these transistors constitute the outputs 11 and 12 of the transconductor and are connected to the inputs 2 and 3 of the amplifier 1. Between the outputs 11 and 12 of the transconductor 10 a load circuit is arranged, comprising two substantially identical resistors $R_1$ and $R_2$, whose junction point is connected to the common base of two PNP transistors $T_3$ and $T_4$ by means of a diode, the emitters of said PNP transistors being connected to the positive power-supply terminal and the collectors to the outputs 11 and 12 of the transconductor.

It is to be noted that, instead of by means of a diode, the junction point between the resistors $R_1$ and $R_2$ may also be connected to the common base of the transistors $T_3$ and $T_4$ by means of a transistor whose control electrode is at a reference voltage of an operational amplifier of which one input is connected to the junction point between the resistors $R_1$, $R_2$ and the other input is at a reference voltage.

By means of the resistors $R_1$ and $R_2$ and the diode $D_1$ the common base of the transistors $T_3$ and $T_4$ is driven in such a way that the transistors $T_3$ and $T_4$ supply the direct currents for the transistors $T_1$ and $T_2$. The direct voltages on the outputs 11 and 12 of the transconductor are then equal to the positive power-supply voltage minus one diode voltage and one base-emitter voltage. As the direct voltages on the outputs 11 and 12 are equal, no direct current will flow through the resistors $R_1$ and $R_2$. A balanced input voltage is applied to the input terminals 6 and 7 of the filter arrangement. The transconductor 10 converts this input voltage into two signal currents of opposite phase which are superimposed on the direct currents through the transistors $T_1$ and $T_2$. The signal current through the resistors $R_1$ and $R_2$ is very small because the negative-eedback amplifier 1 ensures that the signal voltage between inputs 2 and 3 is very low. The signal currents flowing into the collectors of the transistors $T_1$ and $T_2$ are applied almost fully to the capacitors $C_1$ and $C_2$ on account of the negative feedback of the amplifier 1. Consequently, an integrated balanced output voltage will appear on the outputs 4 and 5 of the amplifier 1. The even-order harmonic distortions caused by the non-linearities of the arrangement substantially cancel each other owing to the symmetrical construction of the filter arrangement and the balanced drive. As a result of this, the range over which the output voltage increases as a linear function of the input voltage is comparatively large. The time constant of the arrangement is equal to the product of the capacitance of the capacitors $C_1$ and $C_2$ and the inverse of the transconductance of the transconductor 10. The transconductance of the transconductor can then be varied over a wide range by varying the current of the current source $I_1$, so that a large range of time constants can be obtained.

Figure 2:
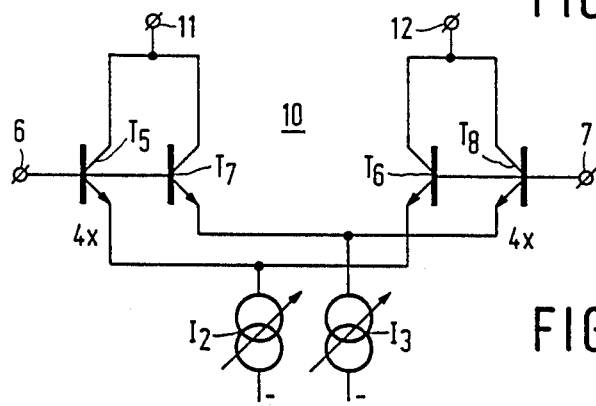
FIG. 2 shows a transconductance circuit for use in the arrangement shown in FIG. 1.

FIG. 2 shows an example of a transconductor for use in the arrangement shown in FIG. 1. Identical parts bear the same reference numerals. It is to be noted that this transconductor is known per se from the article "Bipolar Integration of analog gyrator and laguerre type filters (transconductor-capacitor filters)" Proeeedings ECCTD '83, September 1983, pages 107–110. The transconductor 10 comprises a first differential amplifier which is constituted by two transistors $T_5$ and $T_6$ whose bases are connected to the input terminals 6 and 7, whose emitters are connected to a common current source $I_1$, and whose collectors are connected to the outputs 11 and 12. The emitter area of the transistor $T_5$ is four times as large as that of the transistor $T_6$. Further, the transconductor 10 comprises a second differential amplifier comprising two transistors $T_7$ and $T_8$ having their bases connected to the bases of the transistors $T_5$ and $T_6$, their collectors to the collectors of the transistors $T_5$ and $T_6$, and their emitters to the common current source $I_3$ which is identical to the current source $I_2$. The transistor $T_8$ has an emitter area which is four times as large as that of the transistor $T_7$. For this ratio between the emitter areas of the transistors the linear range of the transconductor 10 is found to be approximately five times as large as that of the transconductor shown in FIG. 1.

Figure 3:
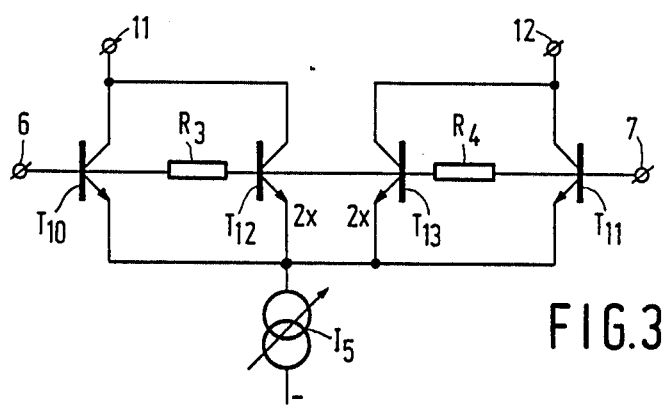
FIG. 3 shows another transconductance circuit for use in the arrangement of FIG. 1.

FIG. 3 shows another example of a transconductor for use in the arrangement shown in FIG. 1. It is to be noted that this transconductor is described in a U.S. Pat.

No. 4,723,110. The transconductor 10 comprises a differential amplifier, comprising two transistors whose bases are connected to the input terminals, whose emitters are connected to a common current source $I_5$, and whose collectors are connected to the outputs 11 and 12 of the transconductor. A voltage divider comprising two substantially identical resistors $R_3$ and $R_4$ is arranged between the bases of the transistors $T_{10}$ and $T_{11}$. The junction point between the resistors $R_3$ and $R_4$ is connected to the bases of two transistors $T_{12}$ and $T_{13}$ whose emitters are connected to the emitters of the transistors $T_{10}$ and $T_{11}$ and whose collectors are connected to the outputs 11 and 12. The emitter areas of these transistors $T_{12}$ and $T_{13}$ are twice as large as those of the transistors $T_{10}$ and $T_{11}$. For this ratio between the emitter areas the linear voltage range of the transconductor is found to be approximately twice as large as that of the transconductor shown in FIG. 2.

For transconductors constructed by means of bipolar transistors the transconductance is generally proportional to the current of the supply-current source. By making this current programmable, for example in a binary manner, it is possible to construct programmable filters.

Figure 4:
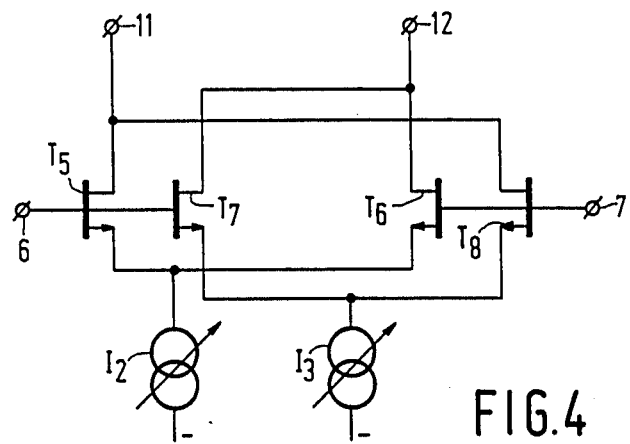
FIG. 4 shows yet another transconductance circuit for the arrangement of FIG. 1.

FIG. 4 shows another transconductor for use in the arrangement shown in FIG. 1. Identical parts bear the same reference numerals as in FIG. 2. This transconductor comprises MOS transistors instead of bipolar transistors. It is to be noted that this transconductor is known per se from the article "Analog Integrated Filters or Continous Time Filters for LSI and VLSI", ESSCIRC Sept. '85, page 292. The transconductor 10 comprises a first differential amplifier comprising two MOS transistors $T_5$ and $T_6$ whose gates are connected to the input terminals 6 and 7, whose source electrodes are connected to a first current source $I_2$, and whose drain electrodes are connected to the outputs 11 and 12. The transconductor 10 further comprises a second differential amplifier comprising two MOS transistors $T_7$ and $T_8$ whose source electrodes are connected to a second current source $I_3$. The gate of the transistor $T_7$ is connected to that of the transistor $T_5$ and the gate of the transistor $T_8$ is connected to that of the transistor $T_6$. The drain of the transistor $T_7$ is connected to the drain of the transistor $T_6$ and the drain of the transistor $T_8$ is connected to the drain of the transistor $T_5$. The transistors $T_5$, $T_6$, $T_7$ and $T_8$ are identical to each other. This transconductor also has a comparatively large linear voltage range.

It is to be noted that instead of the transconductors shown other transconductors may be employed.

Figure 5:
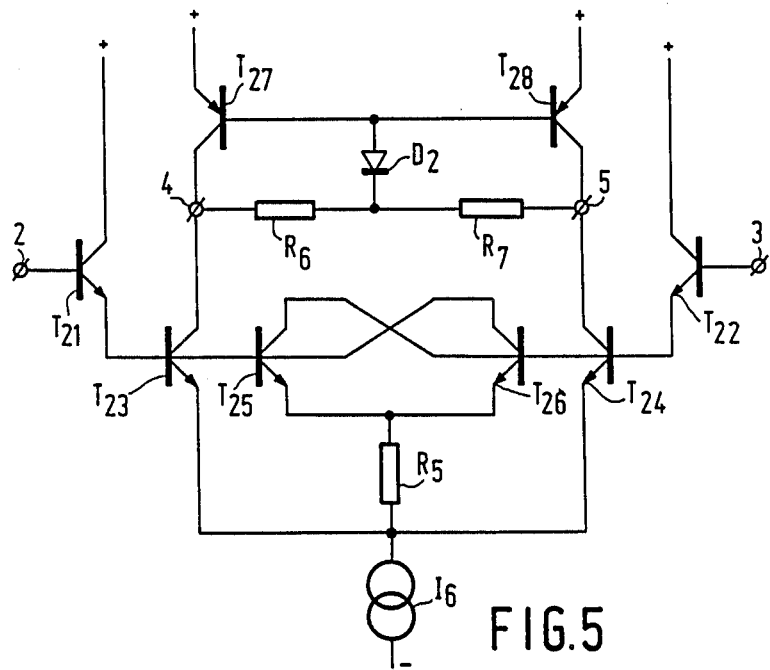
FIG. 5 shows an amplifier for use in the arrangement of FIG. 1.

FIG. 5 shows a suitable example of an amplifier 1 for use in the filter arrangement shown in FIG. 1. The amplifier 1 comprises a differential pair with the transistors $T_{21}$ and $T_{22}$ whose bases constitute the non-inverting input 2 and the inverting input 3, whose collectors are connected to the positive power-supply terminal, and whose emitters are connected to the bases of two transistors $T_{25}$ and $T_{26}$ arranged as a differential pair, whose collectors are cross-coupled to the bases and whose emitters are connected to a current source $I_6$ via a common resistor $R_5$. Further, the amplifier comprises two transistors $T_{23}$ and $T_{24}$ arranged as a differential pair, whose bases ar connected to the emitters of the transistors $T_{21}$ and $T_{22}$ and whose emitters are connected to the current source $I_6$. The collectors of the transistors $T_{23}$ and $T_{24}$ constitute the inverting output 4 and the non-inverting output 5 of the amplifier. A load circuit is arranged between the outputs 4 and 5 and comprises a PNP transistor $T_{26}$ whose emitter is connected to the positive power-supply terminal, whose collector is connected to the output 4, and whose base is connected to the base of a PNP transistor $T_{28}$ whose emitter is connected to the positive power-supply terminal and whose collector is connected to the output 5. The common base of the transistors $T_{27}$ and $T_{28}$ is connected to the junction point between two identical resistors $R_6$ and $R_7$ via a diode $D_2$, which resistors are arranged between the outputs 4 and 5. Instead of a diode $D_2$ it is possible to use a transistor whose base is at a reference voltage or an operational amplifier of which one input is connected to the junction point between the resistors $R_6$ and $R_7$ and of which the other input is at a reference voltage. It is to be noted that this amplifier is the subject of patent application Ser. No. 033,127 filed simultaneously with the present Application. In this respect it is observed only that the balanced input voltage applied to the bases 2 and 3 is converted into a balanced current by the differential pair $T_{21}$, $T_{22}$, the differential pair $T_{25}$, $T_{26}$ providing an increased slope of the arrangement. The differential pair $T_{23}$, $T_{24}$ provides additional current gain, which gain is defined by the value of the resistor $R_5$ which determines the ratio between the bias currents of the differential pair $T_{23}$, $T_{24}$ and the differential pair $T_{25}$, $T_{26}$. The load circuit ensures that the direct voltages on the outputs 4 and 5 remain accurately constant. The transistors $T_{27}$ and $T_{28}$ compensate for the bias currents of the transistors $T_{23}$ and $T_{24}$, so that only signal currents appear on the outputs 4 and 5. Since the signal currents on the outputs 4 and 5 remain accurately balanced, no signal voltage will appear on the junction point between the resistors $R_6$ and $R_7$. Therefore, the junction point constitutes a virtual signal ground.

Figure 6:
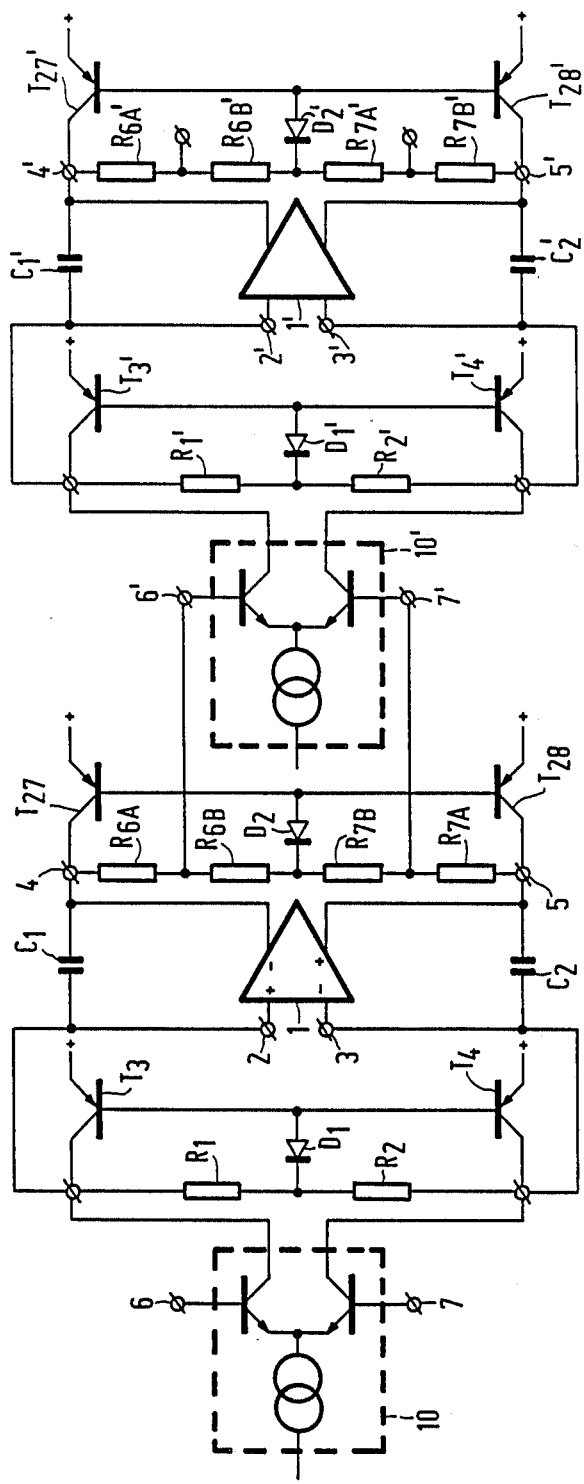
FIG. 6 shows two filter arrangements in accordance with the invention coupled to each other.

FIG. 6 shows two filter arrangements in accordance with the invention coupled to each other. Identical parts bear the same reference numerals as in FIG. 1, the parts of the second amplifier arrangement being primed. The amplifiers 1 and 1' each comprise a load circuit identical to the load circuit of the amplifier shown in FIG. 5, the only difference being that the load resistors $R_6$ and $R_7$ are tapped. The input terminals 5' and 7' of the second filter arrangement are connected to these tappings of the first filter arrangement. The full signal voltage appears across the load resistors $R_6$ and $R_7$. In order to prevent the transconductor 10' from being overdriven only a fraction of this voltage may be applied to the input terminals 6' and 7' of the second filter arrangement. It is to be noted that the input terminals of the second filter arrangement may also be cross-coupled to the outputs of the first amplifier arrangement.

The invention is not limited to the embodiments shown. Within the scope of the invention many variants are conceivable to those skilled in the art. For example, in each embodiment shown one transconductor is connected to the inputs of the amplifier. However, it is alternatively possible to connect a plurality of transconductors to the inputs of the amplifier, another balanced input signal being applied to each transconductor. In addition, it is possible to combine the load circuits of these transconductors. Moreover, it is obvious that the outputs of one or more similrr filter arrangements may be connected directly to the inputs of an amplifier.

What is claimed is:

1. A filter arrangement comprising a balanced amplifier having an inverting input, a non-inverting input, an inverting output, a non-inverting output, a first input terminal and a second input terminal, a first feedback circuit comprising a first capacitor and arranged between the non-inverting output and the inverting input, and a second feedback circuit comprising a second capacitor substantially identical to the first capacitor and arranged between the inverting output and the non-inverting input, characterized in that the filter arrangement further comprises a transconductance circuit for providing a variable transconductance, which circuit comprises two inputs connected to the input terminals of the filter arrangement and two outputs coupled to the inverting and non-inverting inputs of the amplifier, said transconductance circuit comprising a plurality of active devices each having a control input terminal and first and second output terminals, the control input terminals of at least two of said active devices being connected to the input terminals of said filter arrangement, respectively, the first output terminals of said at least two active devices being connected directly together and the second output terminals thereof being connected to said inverting and non-inverting amplifier inputs, respectively.

2. A filter arrangement as claimed in claim 1, characterized in that a load circuit is arranged between the outputs of the transconductance circuit, which load circuit comprises two current-source transistors whose collectors are connected to the outputs of the transconductance circuit and whose bases are connected to a common control input which is coupled to the junction point of two resistors arranged between the outputs of the transconductance circuit.

3. A filter arrangement as claimed in claim 1 or 2, characterized in that the transconductance circuit comprises a differential amplifier with two transistors whose bases are connected to the input terminals, whose collectors are connected to the outputs of the transconductance circuit, and whose emitters are connected to a common variable current source.

4. A filter arrangement as claimed in claim 3, comprising two further transistors and characterized in that a voltage divider is arranged between the bases of the two transistors and has its junction point connected to the bases of said two further transistors whose emitters are connected to the common current source and whose collectors are connected to the outputs of the transconductance circuit.

5. A filter arrangement as claimed in claim 1 or 2, characterized in that the transconductance circuit comprises two differential amplifiers each comprising two transistors which have unequal emitter areas and whose emitters are connected to a common current source whose current is variable, of which two differential amplifiers the bases are interconnected and the collectors of said two transistors with different emitter areas are connected to each other and to an output of the transconductance circuit.

6. A filter arrangement as claimed in claim 1 or 2, characterized in that the transconductance circuit comprises a first differential amplifier having two field-effect transistors whose source electrodes are connected to a first common current source and whose drain electrodes are connected to the outputs of the transconductance circuit, and a second differential amplifier arranged in parallel with said first differential amplifier and comprising two field-effect transistors whose source electrodes are connected to a second common current source and whose drain electrodes are cross-coupled to the drain electrodes of the field-effect transistors of the first differential amplifier.

7. A filter arrangement as claimed in claim 1 or 2, characterized in that the balanced amplifier comprises two transistors arranged as a differential pair, whose bases are coupled to the non-inverting input and the inverting input and whose collectors are connected to the inverting output and the non-inverting output of the amplifier, between which two outputs a load circuit is arranged comprising two current-source transistors whose collectors are connected to the inverting output and the non-inverting output of the amplifier and whose bases are connected to a common control input which is coupled to the junction point between two load resistors arranged between the outputs of the amplifier.

8. A filter arrangement as claimed in claim 7, characterized in that the filter arrangement is coupled to a second filter arrangement, the input terminals of the second filter arrangement being connected to tappings provided on the load resistors of the load circuit of the amplifier of the first filter arrangement.

* * * * *